United States Patent [19]

Reele et al.

[11] Patent Number: 5,169,056
[45] Date of Patent: Dec. 8, 1992

[54] CONNECTING OF SEMICONDUCTOR CHIPS TO CIRCUIT SUBSTRATES

[75] Inventors: Samuel Reele; Thomas R. Pian, both of Rochester, N.Y.

[73] Assignee: Eastman Kodak Company, Rochester, N.Y.

[21] Appl. No.: 838,979

[22] Filed: Feb. 21, 1992

[51] Int. Cl.$^5$ .............................. H01L 21/60
[52] U.S. Cl. ................. 228/180.2; 228/212; 437/211
[58] Field of Search ............ 228/135, 177, 180.2, 228/186, 212; 437/211; 29/841

[56] References Cited

U.S. PATENT DOCUMENTS

| | | | |
|---|---|---|---|
| 3,793,714 | 2/1974 | Bylander | 437/211 |
| 4,208,005 | 6/1980 | Nate et al. | 228/175 |
| 4,314,870 | 2/1982 | Ishida et al. | 228/175 |
| 4,604,644 | 8/1986 | Beckham et al. | 228/175 |
| 4,749,120 | 6/1988 | Hatada | 228/180.2 |
| 4,929,965 | 5/1990 | Fuse | 346/107 R |
| 4,942,140 | 7/1990 | Ootsuki et al. | 437/211 |
| 5,012,969 | 5/1991 | Hatada et al. | 228/180.2 |

FOREIGN PATENT DOCUMENTS

| | | | |
|---|---|---|---|
| 207689 | 11/1984 | Japan | 228/180.2 |
| 147536 | 7/1986 | Japan | 437/211 |
| 132331 | 6/1987 | Japan | 437/211 |
| 284890 | 11/1988 | Japan | 228/180.2 |
| 143436 | 6/1990 | Japan | 437/211 |

*Primary Examiner*—Samuel M. Heinrich
*Attorney, Agent, or Firm*—Norman Rushefsky

[57] ABSTRACT

A method and article made by such method are described for connecting electrodes on one face of an integrated circuit semiconductor device with those on a supporting substrate. The method comprises positioning electrodes formed on one face of the device into engagement with electrodes formed on the substrate. A force is applied to press the electrodes together and during application of the force a first adhesive is applied along only a minor portion of two edges of the device. The first adhesive is stiffened to provide a temporary connection of the device and the substrate. A mass of a second adhesive is applied over a face of said device opposite said one face and onto portions of the substrate adjacent the periphery of the device with substantially no adhesive located between the one face of the device and the substrate at a center area of the one face. The second adhesive is hardened to form an adhesive dome that permanently connects the device to the substrate.

5 Claims, 1 Drawing Sheet

CONNECTING OF SEMICONDUCTOR CHIPS TO CIRCUIT SUBSTRATES

BACKGROUND OF THE INVENTION

1. Field of the Invention

This invention relates to a method of connecting semiconductor chips or dice to circuit substrates such as circuit boards.

2. Description of the Prior Art

In the prior art it is well known to connect semiconductor chips or dice to circuit substrates such as circuit boards, with adhesive. As noted in U.S. Pat. No. 5,012,969, methods are known for mounting a semiconductor up on a circuit substrate so that the semiconductor is placed face down on the circuit substrate in what is called a flip-chip arrangement. In such an arrangement, a solder bump may be formed on the electrode of the semiconductor die and this bump joined with a wiring electrode on the circuit substrate. In such methods, the electrodes of the semiconductor device and the electrodes of the circuit substrate are mechanically and electrically connected by the solder bumps. A problem in such a connection is that a thermal or mechanical stress acts on the semiconductor device or circuit substrate and the stress is entirely concentrated on the junctions of the solder bumps, possibly resulting in the breakage of some of the junctions and the lowering of the device reliability.

In accordance with one solution to this problem described in U.S. Pat. No. 4,749,120, an electrode is disposed on a semiconductor die and while positioning an electrode of a circuit substrate with the electrode of the die, an insulating resin is inserted between the front face of the semiconductor die and the circuit substrate and the insulating resin is stiffened or hardened while applying pressure to the back face of the semiconductor die. By making use of the contracting force of the insulating resin at the time of stiffening, the electrode of the semiconductor die is pressed against the electrode of the circuit substrate thereby obtaining an electrical connection.

As noted in U.S. Pat. No. 5,012,969, this solution causes a bending stress to be formed on the semiconductor die or circuit substrate, and the connection between the electrodes is partially impaired and it is difficult to obtain a favorable connection. Also, when the pressure is high, there is a risk of destroying the semiconductor die. This can be particularly a problem with fragile devices other than silicon such as GaAs.

Still further, since the insulating resin is formed on the entire from facing surface of the semiconductor die, when the semiconductor die or circuit substrate is heated and rises in temperature, the entire simulating resin tends to expand. When the force of expansion exceeds the contracting force, the electrode at the pressed part and the wiring electrode will separate from each other, and this often caused defective junctions. To overcome this noted problem of the prior art, the solution proposed in U.S. Pat. No. 5,9012,969 is to inject a light and heat-stiffening insulating resin about the periphery of the semiconductor die, at least in the gap between the die and the circuit substrate while applying pressure by means of a pressure tool to urge their respective electrodes into intimate contact. Afterwards a light source such as UV is placed proximate the periphery to stiffen the adhesive while further pressure is applied when irradiating.

A problem with this approach is that this process is time consuming in that light-sensitive adhesives require a light source to be moved about the periphery of the device nd the light-sensitive adhesives are relatively expansive.

It is, therefore, an object of the invention to overcome the problems associated with the prior art.

SUMMARY OF THE INVENTION

In accordance with reinvention, there is provided a method of connecting electrodes on one face of an integrated circuit semiconductor device with those on a supporting substrate, the method comprising:

positioning electrodes formed on the one face of the device into engagement with electrodes formed on the substrate, applying a first adhesive substance along only a minor portion of the peripheral length of edges of the device to provide a temporary connection of the device and the substrate; and applying a mass of a second adhesive over a face of said device opposite said one face and onto portions of the substrate adjacent the periphery of the device; and hardening the second adhesive to form an adhesive dome that permanently connects the device to the substrate.

DETAILED DESCRIPTION OF THE PREFERRED EMBODIMENT

While the invention will now be described with reference to mounting one die upon a substrate, it will be appreciated that plural dies might be also mounted upon the same substrate.

Figure 1:
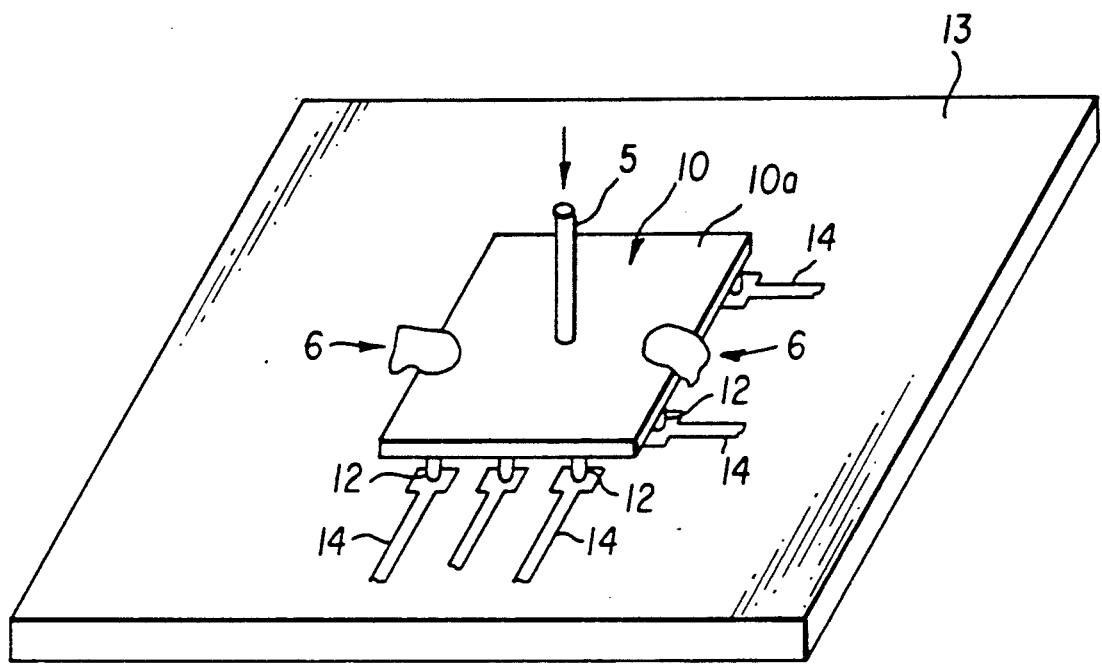
FIG. 1 is a perspective view of a semiconductor device temporarily tacked by a first adhesive to a circuit substrate in accordance with a first step of the method of the invention.

Referring now to FIG. 1, metal electrodes 12 formed on a bottom face 10b of a semiconductor die 10, such as a semiconductor integrated circuit device, and coated metal electrodes 14 of a circuit board substrate 13 are positioned with the electrodes 12 and 14 contacting each other in a flip-chip arrangement. SA force is applied to a top face 10a of the die 10 by means of a pressure tool 5 to force the bumps on electrode 12 of the die into engagement with pads of electrodes 14. A light-stiffening insulating resin 6 is injected by a suitable dispenser at key points along the sides rather than contiguous along all edges of the semiconductor device, at least in the gap between the semiconductor device 10 and circuit substrate 13 to tack the die to the substrate 13. Only two portions of two peripheral edge margins of semiconductor device 1 are tacked with the resin. Afterwards, light having a wavelength for stiffening the light-stiffening insulating resin 6 is emitted form an appropriate source (not shown) near the tacking adhesive. For example, in the case of an ultraviolet ray stiffening type resin, ultraviolet rays are emitted to stiffen the light-stiffening resin 6. After stiffening, the tool 5 is removed. As a result, the electrodes 12 and 14 are electrically connected to each other, and the semiconductor device 10 and circuit substrate 13 are mutually, but temporarily, adhered by the resin 6. The electrodes 12 of the semiconductor device may include gold bumps of, for example, 5 to 20 μm as is well known. These bumps may instead be formed on the electrode 14 of the circuit substrate.

The light-stiffening resin after stiffening is, as shown in FIG. 1, present at only a minor portion of the peripheral length of each of the edges of semiconductor device 10.

Figure 2:
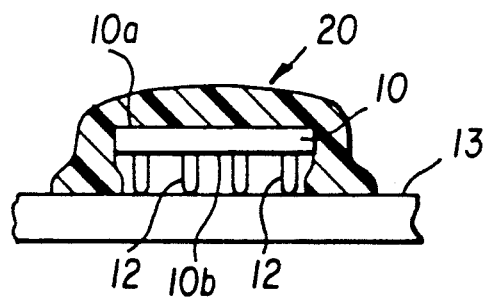
FIG. 2 is a sectional view illustrating a semiconductor device permanently adhered to a circuit substrate in accordance with the invention.

The light-stiffening resin 6 may be either acrylic or epoxy resins stiffened by light only, or resins stiffened by both light and heat may be used. Alteratively, a tap may be used to provide the temporary tack connection. After providing a temporary tack adhesive to all the devices or dies to be connected to the substrate, the die may be tested or burned-in immediately to facilitate repair. In burn-in testing a souce(s) of electrical energy is provided to selected electrodes for suitable period(s) of item as is well known. Afterwards, a permanent attachment is made by depositing a viscous adhesive resin over the top of each of the dies as illustrated in FIG. 2. As the second adhesive resin is caused to cure or harden, say by application of heat, light and/or through passage of time, a dome 20 is formed over each of the dies. In addition to providing a permanent connection of each of the dies to the substrate, the second adhesive, which may be an epoxy, may also provide a hermetic seal to a die. Alternatively, if the characteristics of the adhesive do into provide a hermetic seal, a separate conformal coat may be overcoated upon the adhesive dome suing a material that will provide the hermetic seal with the absence of adhesive at a center area of the bottom face 10b, between the bottom face 10b and the substrate 13. The coat will follow the adhesive easily and not have to cover the abrupt corners of the die.

The adhesive used may be of a known heat-conductive type for removing heat buildup from the die.

In addition of the benefits recited above, additional advantages are provided by the method of the invention. For example, the die while pressed against the substrate by tool can also e tested for $I_{cc}$ (or forward-biased unctions) when provided with appropriate input-/output signals before tacking. This can be especially important in testing of dies with ground shield such as CCD's or other light-sensitive dies. A burn-in testing step at the substrate level may also be made before permanently securing the die to the substrate with the viscous adhesive that forms the dome. In addition repairability is earlier since virtually all the adhesive is visually accessible and not trapped under all areas of the die.

the invention has been described in detail with particular reference to a preferred embodiment thereof, but it will be understood that variations and modifications can e effected within the spirit and scope of the invention as described hereinabove and as defined in the appended claims.

We claim:

1. A method of connecting electrodes on one face of an integrated circuit semiconductor device with those on a supporting substrate, comprising:
   positioning electrodes formed on the one face of the device into engagement with electrodes formed on the substrate;
   applying a force to press the electrodes together;
   applying a fist adhesive substance along only a minor portion of the peripheral length of the edges of the device to provide a temporary connection of the device and the substrate; and
   applying a mass of a second adhesive over a face of said device opposite said one face and onto portions of the substrate adjacent the periphery of the device with substantially no adhesive located between the one face of the device and substrate at a center area of the front face and hardening the second adhesive to form an adhesive dome that permanently connects the device to the substrate.

2. The method of claim 1 and wherein the first adhesive is applied only along tow side edges of the device.

3. The method of claim 2 and including the step of applying electrical energy to said divide after providing the temporary connection but prior to applying the mass of second adhesive.

4. The method of claim 1 and including the step of applying electrical energy to said device after providing the temporary connection but prior to applying the mass of second adhesive.

5. The method of claim 1 and including the step of stiffening the first adhesive.

* * * * *